United States Patent
Moroz et al.

(10) Patent No.: US 7,584,438 B2
(45) Date of Patent: Sep. 1, 2009

(54) METHOD FOR RAPID ESTIMATION OF LAYOUT-DEPENDENT THRESHOLD VOLTAGE VARIATION IN A MOSFET ARRAY

(75) Inventors: Victor Moroz, Saratoga, CA (US); Dipankar Pramanik, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 41 days.

(21) Appl. No.: 11/757,335

(22) Filed: Jun. 1, 2007

(65) Prior Publication Data
US 2008/0301599 A1 Dec. 4, 2008

(51) Int. Cl.
*G06F 17/50* (2006.01)
(52) U.S. Cl. ............................. 716/4; 716/6
(58) Field of Classification Search .................. 716/4–6
See application file for complete search history.

(56) References Cited

U.S. PATENT DOCUMENTS 5,872,716 A * 2/1999 Yano et al. ..................... 716/1
7,302,376 B2 11/2007 Adler et al.
7,337,420 B2 * 2/2008 Chidambarrao et al. ........ 716/8

OTHER PUBLICATIONS

Griffin, P. B. et al., "Process Physics Determining 2-D Impurity Profiles in VLSI Devices," IEEE, 1986, pp. 522-525.
H. Fukutome et al., "Direct Measurement of Effects of Shallow-Trench Isolation on Carrier Profiles in Sub-50 nm N-MOSFETSs," 2005 Symposium on VLSI Technology Digest of Technical Papers, pp. 140-141.
Moroz, Victor et al., "Suppressing Layout-Induced Threshold Variations by Halo Engineering," presented at 210th Meeting of the Electrochemical Society, Cancun, Mexico, Oct. 29-Nov. 3, 2006, 6 pp.

* cited by examiner

*Primary Examiner*—Jack Chiang
*Assistant Examiner*—Binh C Tat
(74) *Attorney, Agent, or Firm*—Warren S. Wolfeld; Haynes, Beffel & Wolfeld, LLP

(57) ABSTRACT

An automated method for estimating layout-induced variations in threshold voltage in an integrated circuit layout. The method begins with the steps of selecting a diffusion area within the layout for analysis. Then, the system identifies Si/STI edges on the selected area as well as channel areas and their associated gate/Si edges. Next, the threshold voltage variations in each identified channel area are identified, which requires further steps of calculating threshold voltage variations due to effects in a longitudinal direction; calculating threshold voltage variations due to effects in a transverse direction; and combining the longitudinal and transverse variations to provide an overall variation. Finally, a total variation is determined by combining variations from individual channel variations.

6 Claims, 8 Drawing Sheets

METHOD FOR RAPID ESTIMATION OF LAYOUT-DEPENDENT THRESHOLD VOLTAGE VARIATION IN A MOSFET ARRAY

BACKGROUND

The invention relates to integrated circuit devices, and more particularly to the estimation of layout sensitivity in a transistor array.

It has long been known that semiconductor materials such as silicon and germanium exhibit the piezoelectric effect (mechanical stress-induced changes in electrical resistance). See for example C. S. Smith, "Piezoresistance effect in germanium and silicon", Phys. Rev., vol. 94, pp. 42-49 (1954), incorporated by reference herein. It has also been observed that stress variations in a transistor array can produce variations in carrier mobility, which in turn leads to variations in threshold voltage in the transistors of the array. That problem, and a solution for it, are set out in U.S. patent application Ser. No. 11/291,294, entitled "Analysis of Stress Impact on Transistor Performance", assigned to the assignee hereof.

Further study has shown, however, that beyond stress impact on electron and hole mobilities, layout also affects threshold voltage, suggesting some additional factor at work. Variations encountered have been far from trivial, with swings of over 20 mV being common. The art has not suggested any potential causes for such problems, nor has it presented solutions. Thus, it has remained for the present inventors to discover the cause of such variations and to devise solutions, all of which are set out below.

SUMMARY

An aspect of the invention is an automated method for estimating layout-induced variations in threshold voltage in an integrated circuit layout. The method begins with the steps of selecting a diffusion area within the layout for analysis. Then, the system identifies Si/STI edges on the selected area as well as channel areas and their associated gate/Si edges. Next, the threshold voltage variations in each identified channel area are identified, which requires further steps of calculating threshold voltage variations due to effects in a longitudinal direction; calculating threshold voltage variations due to effects in a transverse direction; and combining the longitudinal and transverse variations to provide an overall variation. Finally, a total variation is determined by combining variations from individual channel variations.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1A:
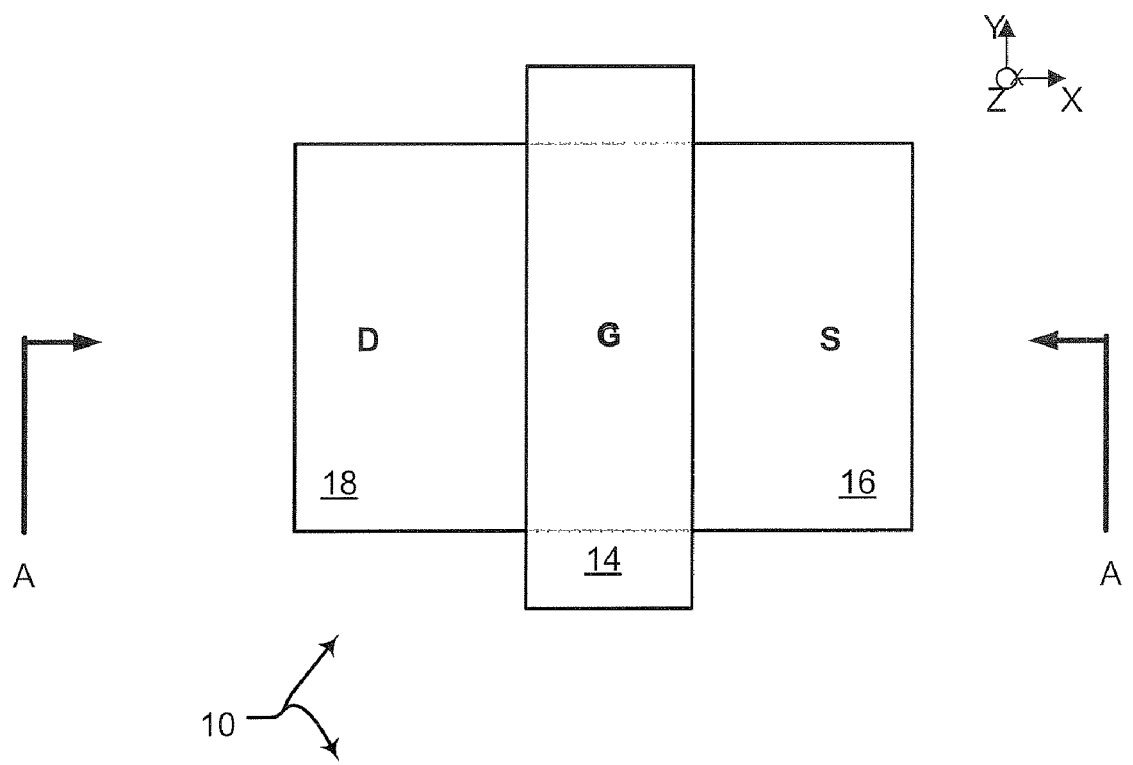
FIG. 1a illustrates an embodiment of a single transistor constructed according to the claimed invention.
Figure 1A:
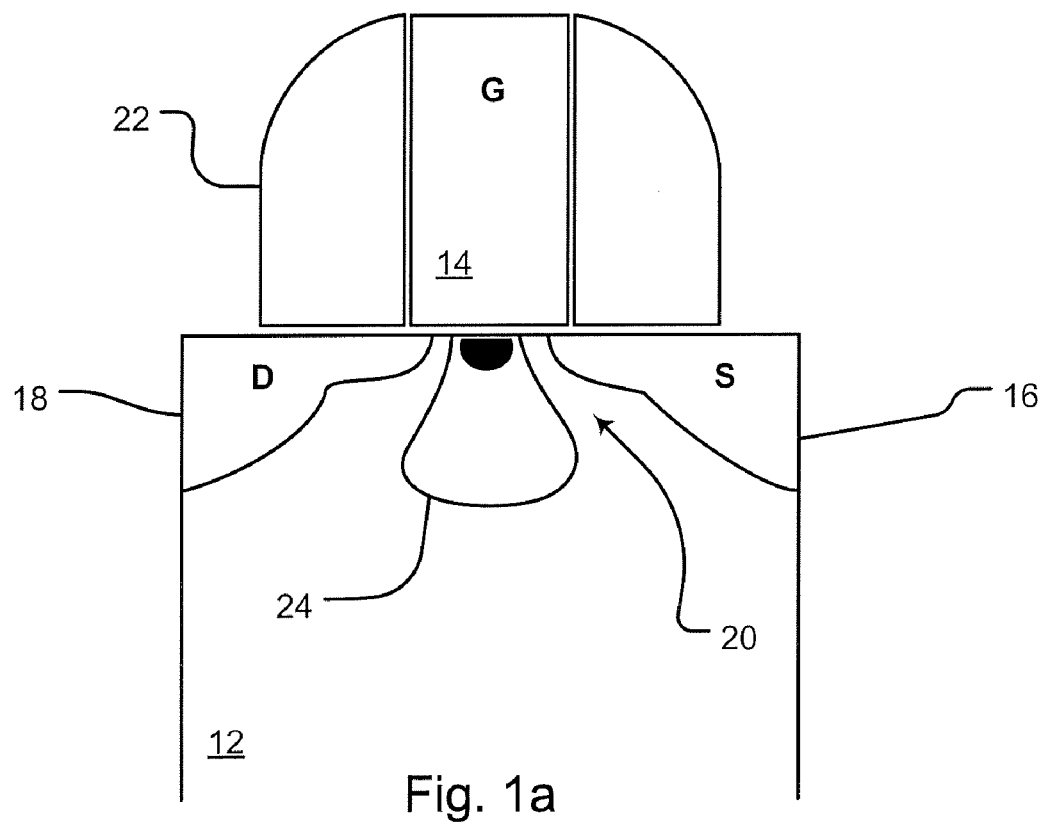

The claimed invention can best be understood by first considering an illustrative MOS transistor 10, shown in FIG. 1a, which shows both a plan view (upper portion) and a cross-section taken on line A-A (bottom portion). There, a diffusion region 12 includes a source region 16 and drain region 18 formed in the diffusion region, with a gap between these regions overlain by a gate 14. The area under the gate is the channel 20. Spacers 22 lie on either side of the gate (not shown in plan view). It will be understood that materials and fabrication techniques relating to these components, and to the MOS device as a whole, are wholly known in the art and are thus not described in any detail here. It is anticipated that the array would be formed in a Partially Depleted, Silicon-on-Insulator (PDSOI MOSFET) substrate, but the teachings of the present application apply to bulk configurations as well. It will be noted that the drawings depict bulk MOSFET devices. Further, it is well-known in the art that the MOSFET channel is doped to adjust the threshold voltage that determines when the MOSFET turns on and off. Channel dopants employed in typical MOSFET devices include species such as boron. The embodiment depicted in FIG. 1a has been so modified, employing ion implantation techniques in general use. The resulting concentration of B atoms in the crystal lattice of the diffusion region is represented by concentration plot, which depicts an inner high-concentration zone and an outer minimal concentration pattern. As is generally known, concentration of dopant decreases from a high concentration zone 23 near the channel surface, generally outward into the channel, to a selected minimal concentration level 24. The concentration levels 23 and 24 are lines of equal dopant concentration within the channel, grading from the regular, smooth curve of the maximum concentration area and grading to the irregular form of minimal concentration plot 24. Although not shown, those in the art will understand that concentration grades from maximum at line 23 to minimal at line 24. The transistor arrays discussed below employ a number of individual transistors, constructed as set out here. Details related here will be omitted for the sake of focus and clarity in the discussion that follows.

Figure 1B:
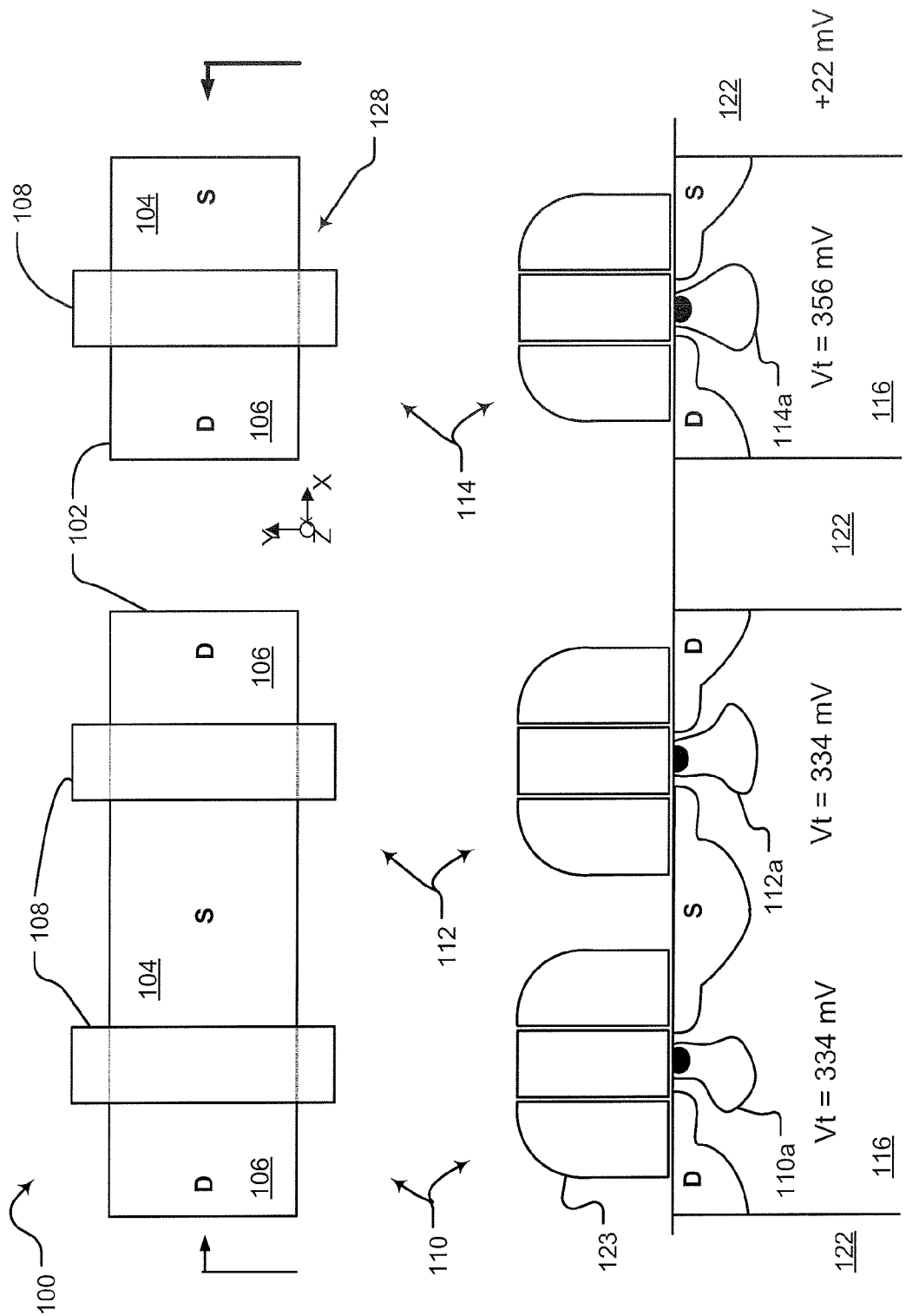
FIG. 1b illustrates an embodiment of a transistor array constructed according to the claimed invention.

FIG. 1b depicts an array 100 of three transistors 110, 112 and 114. As previously described, the array is shown both in plan and cross-section views, and each individual transistor is constructed consistent with the description above. As is commonly seen, a transistor array is formed on a chip, on which are formed a number a relatively large diffusion regions 102. These regions have appropriate dopants added, by conventional processes such as ion implantation, to produce source and drain regions 104 and 106, respectively. Finally, gate material 108 is overlaid in strips. Transistors are isolated to prevent any cross-coupling, by areas of oxide insulator material, such as the Shallow Trench Isolation (STI) areas 122. As the name implies, any suitable insulator can be used in an STI, but tetraethyl orthosilicate (TEOS) is preferred. It should be noted that the nature of transistor layout will result in some individual transistors being isolated by themselves, such as transistor 114, while others are nested into groups of two or more, such as transistors 110 and 112.

Surprisingly, it has been found that even after eliminating stress-induced threshold voltage variations, a large amount of variation remained within a transistor array. As reflected in FIG. 1b, measurements in a typical array revealed $V_t$ variation from 334 mV to 356 mV, a swing of 22 mV. Initial investigation did not immediately uncover the cause of this variation, but it was noted that the variation primarily occurred between individual isolated transistors, such as transistor 114, and those in nested groups, such as transistors 110 and 112.

Figure 1C:
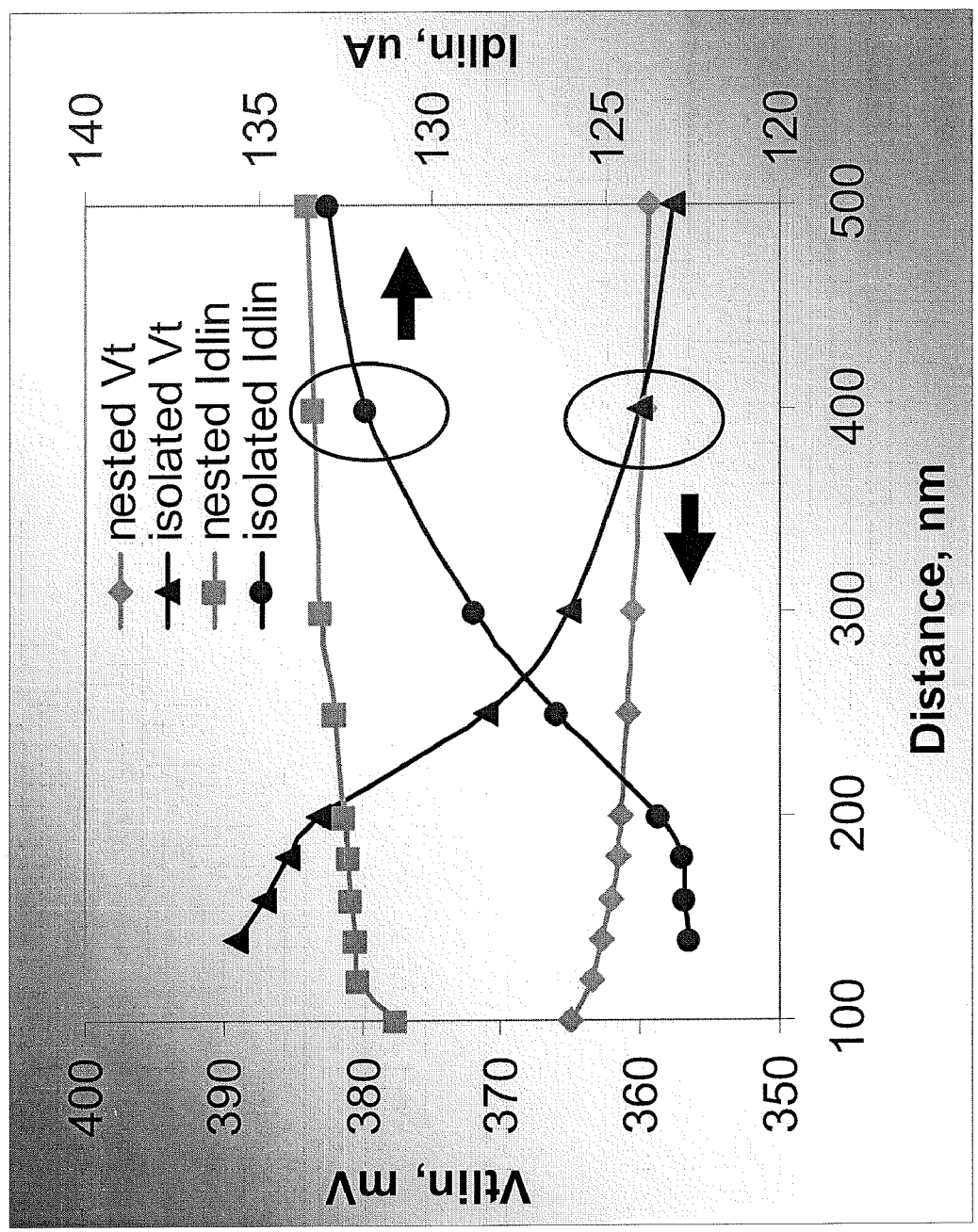
FIG. 1c is a plot of threshold voltage and drain current as functions of the distance from the channel to an STI interface (for isolated transistors) or to the next transistor (for nested gates).

It was noted that one difference between a point in the channels of transistors 110 and 112, compared to a similar point in transistor 114 is the distance from such a point to the two surrounding STI walls. Further investigation led to the data charted in FIG. 1c, which shows both $V_t$ and $I_d$ as functions of distance (in nm) from the channel to surrounding STI walls (for isolated MOSFETs such as transistor 114), and to the next MOSFET (for nested elements such as transistors 110 and 112). As shown, at the distances seen in current fabrication technologies, from 100-200 nm, considerable variation exists, but that variation reduces steadily with increasing distance, and becomes negligible at distances of about 500 nm.

A clue to what is happening at the lattice level can be gained by returning to FIG. 1b. The bottom portion of that drawing includes plots of channel dopant concentration, 110a, 112a, and 114a. As noted above, dopant such as boron is implanted in channel 128 to adjust threshold voltage. That operation generally is accomplished by ion implantation. Although the implantation for transistors 110, 112, and 114 proceeded identically, one can observe an interesting result in FIG. 1b. Namely, the concentration of dopant, as shown by the shape of the profile, skews toward the nearer STI wall. Thus, in profile 110a, the dopant concentration tilts toward the left, on the drawing page, while that of profile 112a tilts in the opposite direction, to right. In contrast, isolated transistor 114 displays a symmetrical concentration pattern 114a, tilting in neither direction.

Figure 1D:
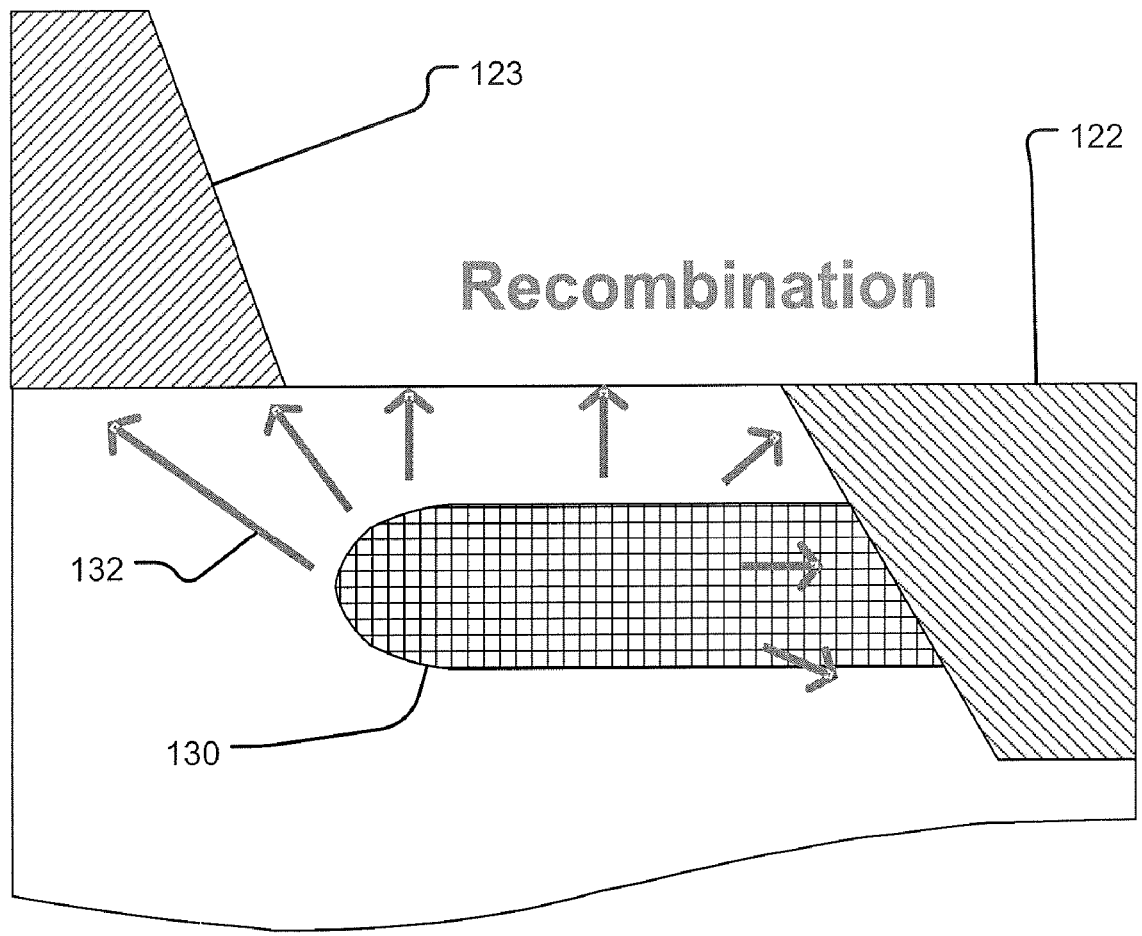
FIG. 1d depicts the recombination of interstitial atoms after channel dopant implantation and anneal.
Figure 3:
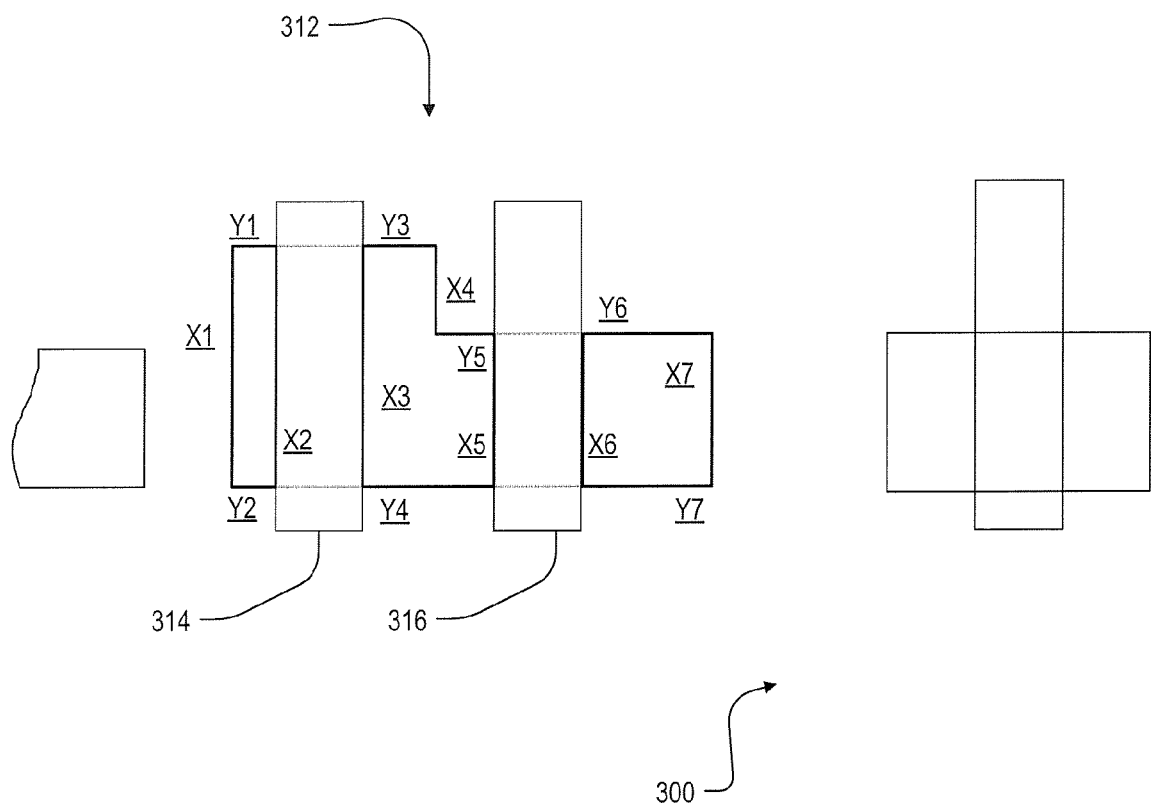
FIG. 3 illustrates a diffusion region under analysis for TED effects, with relevant edges identified.

Based on these results, it was hypothesized that the issue could relate to recombination of interstitial atoms from the damaged areas in the crystal lattice. As shown in FIG. 1d, and as noted above, dopants (such as boron, phosphorus or arsenic) are introduced into the source and drain regions, usually by atom implantation, to create highly conductive layers in that area. The implantation process produces a damaged area 130 in the target crystal lattice, where the newly implanted atoms have displaced atoms (generally Si atoms) previously occupying crystal lattice sites. Of course, the displaced atoms are still present within the lattice, as interstitial atoms between lattice sites. It is further known that the displaced interstitials tend to migrate through a diffusion process toward a surface of the crystal structure, such as the interface between the crystal structure and the STI 122, or interface between silicon channel and gate stack 123, where displaced atoms can recombine at the channel surface onto free Si lattice sites that characterize a surface area. This occurs at elevated temperature during the application of the thermal annealing process. Diffusion paths in FIG. 3 are shown by arrows 132. As can be seen, the distance that individual atoms must travel to reach a surface and there recombine are different, which makes it more likely that atoms located near such a surface will be able to recombine quickly. Movement of the interstitial atoms has the side effect of enhancing the diffusivity of the dopants like boron, phosphorus, or arsenic, a phenomenon known as Transient Enhanced Diffusion (TED). The amount of TED that the dopants experience in the channel determines the concentration of dopants near the channel surface, and therefore determines the threshold voltage. Therefore, recombination of interstitials at different silicon surfaces affects threshold voltages of the adjacent MOSFETs.

Referring back to FIG. 1b, it will be appreciated that the expected recombination pattern for interstitial ions in the channel of transistor 114 would be symmetrical, as the distances to an STI wall are the same on either side of that transistor. For transistors 110 and 112, however, application of this discovery would lead one to expect concentration patterns skewed toward the STI wall, and in fact that is exactly the result found.

U.S. patent application Ser. No. 11/757,294, entitled "Method For Suppressing Layout Sensitivity of Threshold Voltage in a Transistor Array," naming the two inventors hereof and owned by the assignee of this application, teaches and claims a method for smoothing the variations in threshold voltage resulting from TED.

The description herein will also be assisted if the following definitions are established. As shown in FIG. 1, as used herein, the "longitudinal" direction of a transistor is the direction of current flow from source to drain when the transistor is turned on. The "transverse" direction is perpendicular to the longitudinal direction, and perpendicular to the direction of current flow. Both the longitudinal and transverse directions of the transistor are considered to be "lateral" directions, meaning a direction that is parallel to the surface. Other "lateral" directions include those (not shown) which are parallel to the surface but intersect both the transverse and longitudinal directions at angles. The "vertical" direction is normal to the surface of the channel and therefore perpendicular to all possible lateral directions. The "length" of a structure in the layout is its length in the longitudinal direction, and its "width" is its width in the transverse direction. It can be seen from the layout of transistor 114 that the length of its channel 128 is a significantly shorter than its width, which is typical for the transistors that are used in logic circuits. Also shown in FIG. 1 are the X, Y, and Z coordinate axes. In the layout of FIG. 1, the X direction is the same as the longitudinal direction, the Y direction is the same as the transverse direction, and the Z direction is perpendicular to both the longitudinal and transverse directions, representing a depth into the integrated circuit chip.

Figure 2:
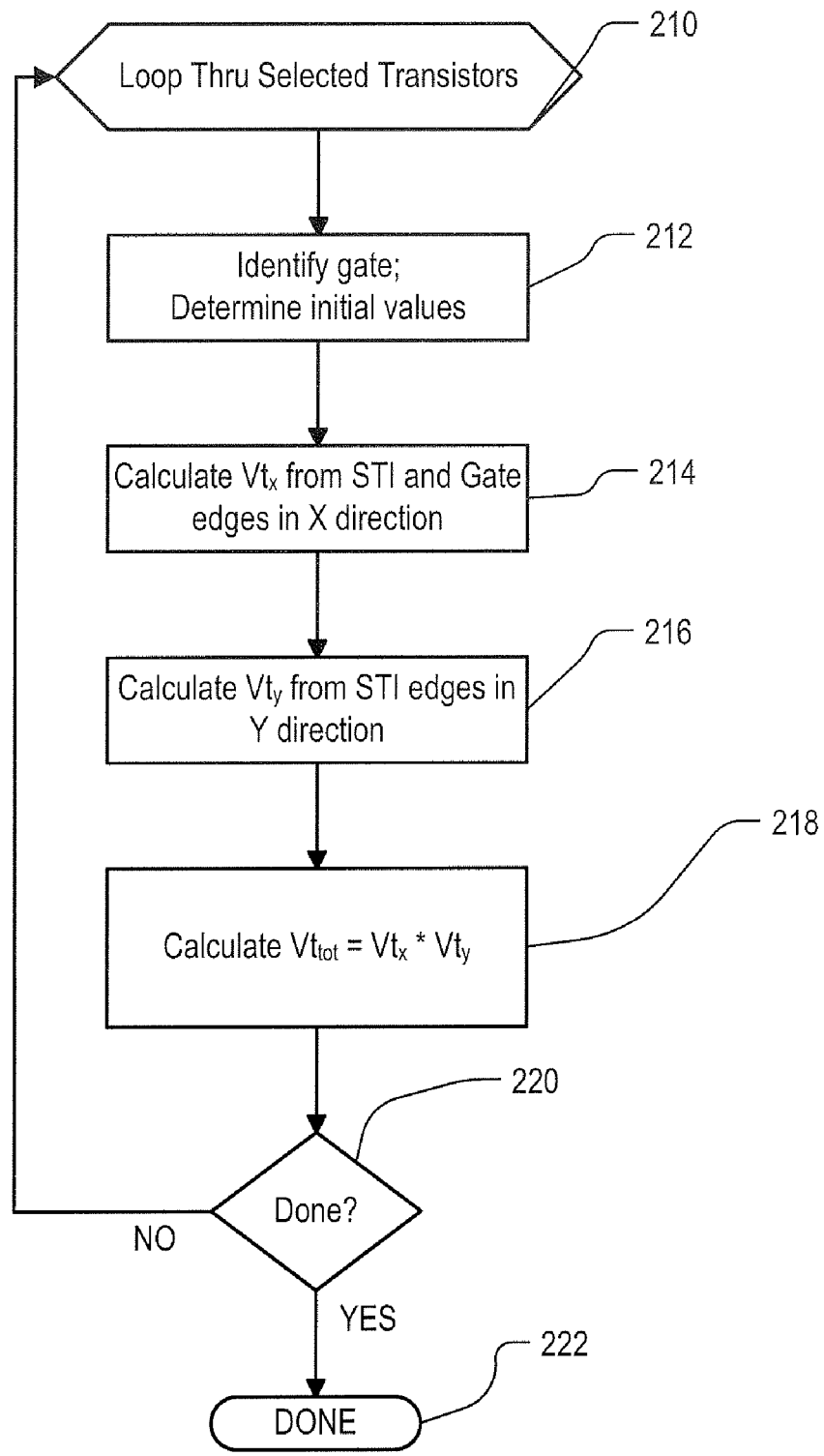
FIG. 2 is a flowchart setting out an overall method for calculating threshold voltage shift values for transistors in a transistor array.

FIG. 2 is an overall flowchart of an embodiment of the invention. As with all flowcharts herein, it will be appreciated that many of the steps can be combined, performed in parallel or performed in a different sequence without affecting the functions achieved. In some cases a re-arrangement of steps will achieve the same results only if certain other changes are made as well, and in other cases a re-arrangement of steps will achieve the same results only if certain conditions are satisfied.

The embodiment of FIG. 2 operates as a portion of an automated integrated circuit design system, such as the SEIS-MOS software marketed by the assignee hereof. It will be understood that other embodiments can be configured to operate in a standalone mode, or as modules operating within a different design environment. In all such instances, the principles of operation of the claimed system are the same.

Referring to FIG. 2, in a step 210, the system first starts a loop through selected transistors in a layout. Because of the speed and accuracy with which threshold voltage shift values can be determined using features of the present invention, it is feasible to determine threshold voltage shifts for all transistors on the integrated circuit chip. Alternatively, a user may select only certain important transistors, such as those along one of the critical paths. Embodiments of the invention enable reasonably accurate analysis of layout regions collectively containing more than 12 or so transistors, or more than 3 diffusion regions, both of which were impractical or impossible with conventional methods. For purposes of illustration, it will be assumed that the first transistor selected in step 210 is transistor 112 (FIG. 1).

In step 212, the system identifies the channel region of the selected transistor and performs initial calculations. In one embodiment, TCAD layout analysis software is employed to accomplish this task readily. This step is best visualized in connection with FIG. 3, in which diffusion region 312 is crossed by strips of gate material to define two transistors 314 and 316. Starting with transistor 314, the initial question is what physical features have an effect on TED. Clearly, TED effects, unlike stress, do not propagate across STI's, so invention can be limited to transistors on a single diffusion area. Moreover, present calculation will be limited to effects in the X and Y directions. It should be noted that the axes here are those of the plan view portion of FIGS. 1a and 1b, taking the X direction as longitudinal and the Y as transverse. From the discussion above, it should be clear that TED will be affected by Si/STI interfaces and gate areas. Thus, in the X direction one can identify edges that intersect the X axis as Si/STI interfaces X1, X4 and X7 and channel edges X2, X3, X4 and X5. In the Y direction, only Si/STI edges will occur, of course, which in this instance are Y1-Y7. This analysis also identifies channel areas as those regions between gate edges X2-X3 and X5-X6. Distances from the center of each gate area are determined for further use. Distances are measured, respectively, in the X direction from the transverse center line of the channel, and in the Y direction from the longitudinal center line.

In the embodiment set out in FIG. 2, it is assumed that a single calculation will provide a sufficiently accurate representation of threshold voltage shift. If desired, sample points within the channel area could be selected. Preferably, sample points would be chosen to lie on a line oriented transversely across the channel, and in the middle of the channel longitudinally, spaced uniformly along that line within the channel. In general, the effort is to estimate the threshold voltage distribution throughout the channel. Since the channel is typically very short in the longitudinal direction, it is usually sufficient to choose sample points all on a single laterally-oriented line disposed in the center of the channel transversely. The designer will choose a number of sample points across the channel that represents an acceptable compromise between accuracy, which improves with more sample points, and speed of analysis, which improves with fewer sample points.

In steps 214 and 216, the threshold voltage shifts in the X and Y directions are approximated. (As used herein, the term "approximation" includes exactness as a special case. Therefore it is possible that in some instances the approximations developed in step 214, 216 will be exact.) These calculations require several process-dependent parameters: $\Delta Vt_{max}$, the maximum threshold voltage shift; $\alpha_{STI}$, $\sigma_{STI}$, and $\beta_{STI}$ produced at the Si/STI interface; and $\alpha_{gate}$, and $\beta_{gate}$ produced at an Si/poly interface. As will be understood by those in the art, these parameters can be calculated, employing TCAD software systems generally available in the art, or a test structure can be fabricated, from which measurements can be made. In either event, once a set of parameters is developed for a given process flow, those parameters remain valid for all layouts fabricated under that process flow.

Figure 4:
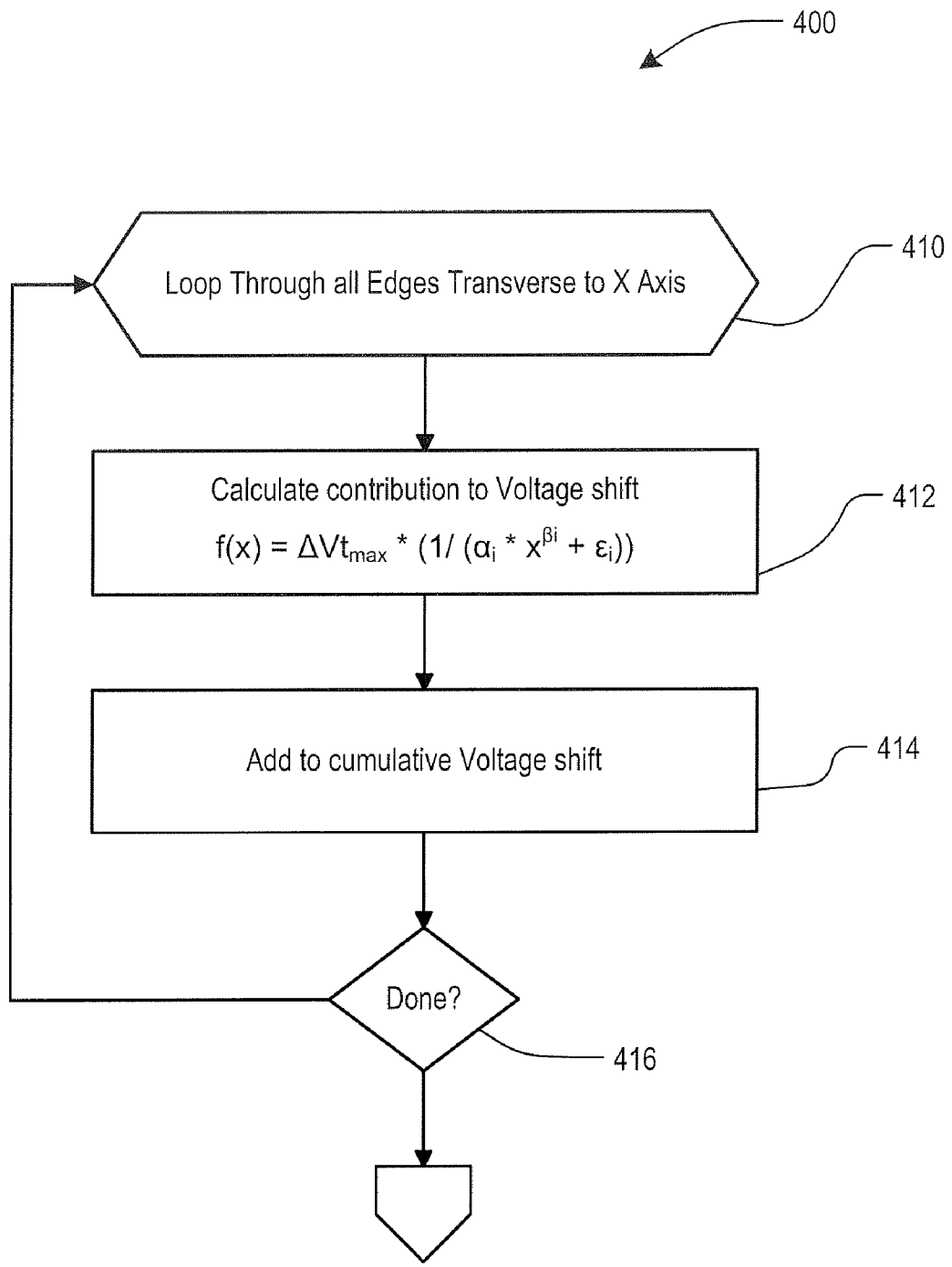
FIG. 4 depicts the process of calculating threshold voltage shifts in the X direction.
Figure 5:
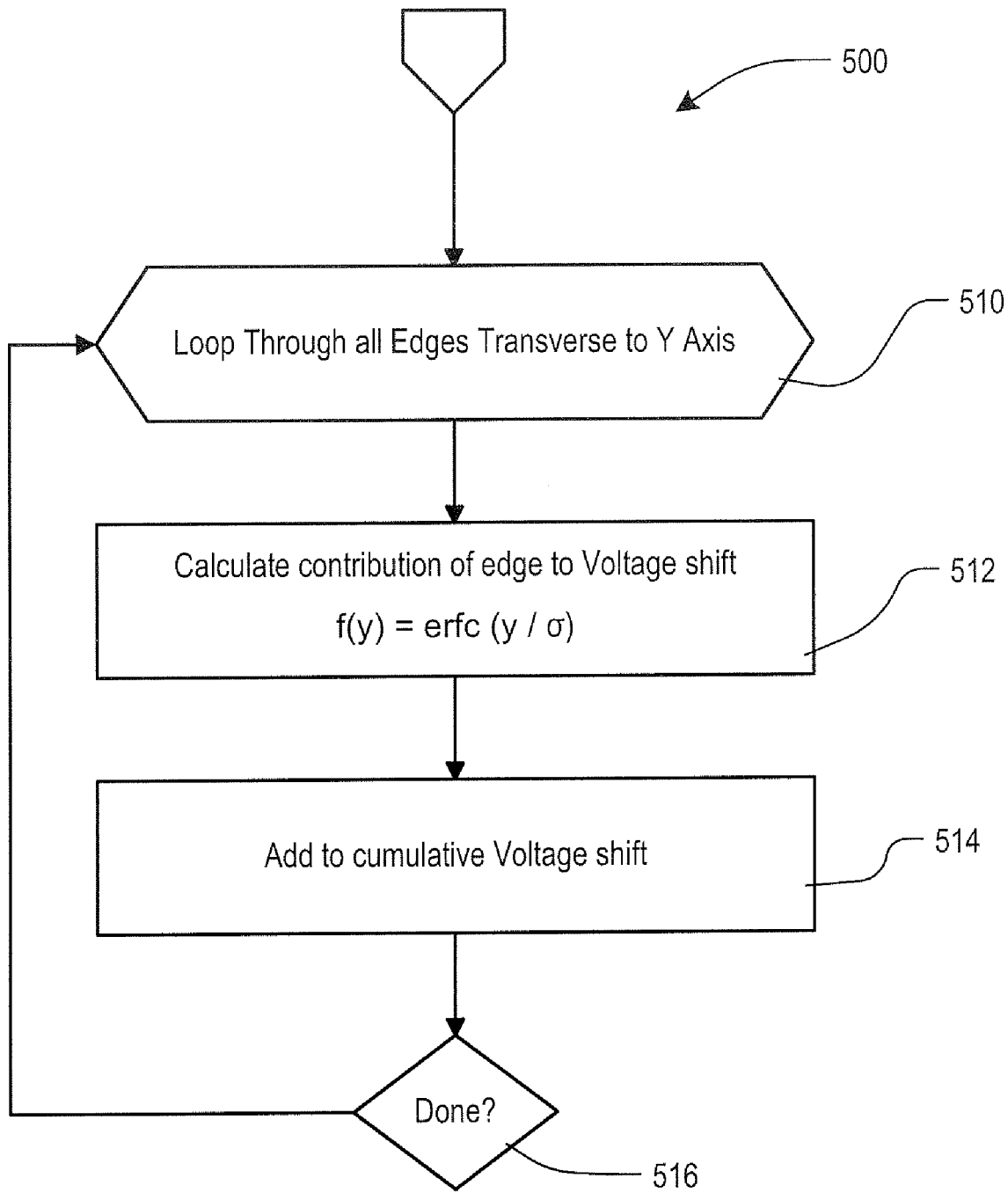
FIG. 5 depicts the process of calculating threshold voltage shifts in the Y direction.

The methods of FIGS. 4 and 5 proceed in similar fashion. In both instances, the method calculates the effect on TED produced by each relevant edge—relevant edges being those transverse to the axis under consideration. The effect of a given edge is obtained by calculating the effect produced by each edge in the diffusion area, which is found by calculating the operation of a decay function at the edge distance. The effects are summed and then multiplied by the parameter $\Delta Vt_{max}$ to obtain a total threshold voltage shift due to effects in that direction.

The decay function employed in these calculations can be different for different embodiments, and for different dimensions of the layout. Because of the difficulty of deriving the true decay function from physical principles, most embodiments will only approximate it. Roughly, the function chosen should be strong but finite in the near field, asymptotically reducing to zero in the far field, and in the midfield it should behave somewhere in between. In a preferred embodiment the following decay function is used for X direction:

$$\lambda_i(x) = 1/((x_i/\alpha)^{\beta_i} + \epsilon_i) \quad (1)$$

In eq.(1), $\alpha_i$ and $\beta_i$ are determined by several factors, including halo implant energy, the amount of implant damage produced by the source/drain implants, and the thermal budget for annealing. The values of $\alpha_i$, $\beta_i$ and $\epsilon_i$, may be estimated using a full TCAD simulation or calibrated using electrical measurements of the test structures.

Other types of decay function approximations can be used in other embodiments. Another function type that might be used is the error function, erfc(r). In some embodiments, the decay function $\lambda_i(r)$ might not be strictly monotonic, where r can be a distance in either the X or Y direction.

It has been found that the decay function set out in Eq. 1 provides the best results when calculating threshold voltage shifts in the X direction, while the error function, erfc, offers superior calculations for edges in the Y direction.

FIG. 4 depicts the process 400 of step 214, calculation of threshold voltage shift due to effects in the X direction. As can be seen in FIG. 3, both gate/STI and Si/STI edges lie transverse to the X axis, and thus control block 410 loops through each of those edges, determining the effect on threshold voltage shift exercised by each of those edges. Block 412 applies Eq. 4 to the data, calculating and then, in block 414, adding the result to a running total effect. The total effect is a sum of the effects from each edge, then multiplied by the parameter $\Delta Vt_{max}$. The loop continues until block 416 detects the end of the process.

FIG. 5 depicts the similar process for calculating the threshold voltage shift in the Y direction, of step 216 (FIG. 2). Here, only Si/STI edges are transverse to the Y axis, and it has been found that the best results are provided by the following expression:

$$\lambda_i(y) = erfc(y/\sigma) \quad (2)$$

The embodiment shown employs the complementary error function, erfc. Those in the art will understand that the non-complementary form of the error function, erf, can also be employed as well as some other mathematical functions with similar spatial behavior. The process 500 proceeds by looping through each relevant edge, in control block 510, and then applying the error function to the previously-gathered data for that edge, step 512, and then adding that result to a cumulative running threshold voltage shift, at step 514. The process continues until all edges have been processed, in step 516.

Note that the methods described herein can be performed by a system for automated estimation of layout-induced variations in threshold voltage in an integrated circuit layout, comprising a digital computer, including a processor, display means and data storage means, and a computer program, stored on the data storage means, which is configured to perform the steps described herein.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art.

The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

We claim as follows:

1. An automated method for estimating layout-induced variations in threshold voltage in an integrated circuit layout, comprising the steps of:
    selecting a diffusion area within the layout for analysis;
    identifying Si/STI edges on the selected area;
    identifying channel areas and their associated gate/Si edges;
    determining threshold voltage variations in each identified channel area, including the steps of
        calculating, by a computer, threshold voltage variations due to effects in a longitudinal direction;
        calculating, by the computer, threshold voltage variations due to effects in a transverse direction; and
        combining, by the computer, the longitudinal and transverse variations to provide an overall variation,
    wherein calculating threshold voltage variations includes multiplying the maximum threshold voltage variation by a decay function of the form $\lambda_i(r)=1/((x_i/\alpha)^{\beta i}+\epsilon_i)$, wherein, $\alpha_i$, $\beta_i$ and $\epsilon_i$, are process and material-related factors, and r is a distance in either the X or Y direction.

2. An automated method for estimating layout-induced variations in threshold voltage in an integrated circuit layout, comprising the steps of:
    selecting a diffusion area within the layout for analysis;
    identifying Si/STI edges on the selected area;
    identifying channel areas and their associated gate/Si edges;
    determining threshold voltage variations in each identified channel area, including the steps of
        calculating, by a computer, threshold voltage variations due to effects in a longitudinal direction;
        calculating, by the computer, threshold voltage variations due to effects in a transverse direction; and
        combining, by the computer, the longitudinal and transverse variations to provide an overall variation,
    wherein calculating threshold voltage variations includes multiplying the maximum threshold voltage variation by a decay function,
    wherein threshold voltage variations due to effects in a longitudinal direction are calculated according to a decay function, $\lambda_i(x)=1/((x_i/\alpha)^{\beta i}+\epsilon_i)$, where $\alpha_i$, $\beta_i$ and $\epsilon_i$, are process and material-related factors; and
    threshold voltage variations due to effects in a transverse direction are calculated according to the complementary error function, erfc.

3. A system for automated estimation of layout-induced variations in threshold voltage in an integrated circuit layout, comprising:
    a digital computer, including a processor, display means and data storage means storing a computer program configured to perform the steps of
    selecting a diffusion area within the layout for analysis;
    identifying Si/STI edges on the selected area;
    identifying channel areas and their associated gate/Si edges;
    determining threshold voltage variations in each identified channel area, including the steps of
        calculating threshold voltage variations due to effects in a longitudinal direction;
        calculating threshold voltage variations due to effects in a transverse direction; and
        combining the longitudinal and transverse variations to provide an overall variation,
    wherein calculating threshold voltage variations includes multiplying the maximum threshold voltage variation by a decay function of the form $\lambda_i(r)=1/((x_i/\alpha)^{\beta i}+\epsilon_i)$, where $\alpha_i$, $\beta_i$ and $\epsilon_i$, are process and material-related factors.

4. A system for automated estimation of layout-induced variations in threshold voltage in an integrated circuit layout, comprising:
    a digital computer, including a processor, display means and data storage means storing a computer program configured to perform the steps of
    selecting a diffusion area within the layout for analysis;
    identifying Si/STI edges on the selected area;
    identifying channel areas and their associated gate/Si edges;
    determining threshold voltage variations in each identified channel area, including the steps of
        calculating threshold voltage variations due to effects in a longitudinal direction;
        calculating threshold voltage variations due to effects in a transverse direction; and
        combining the longitudinal and transverse variations to provide an overall variation,
    wherein calculating threshold voltage variations includes multiplying the maximum threshold voltage variation by a decay function,
    wherein threshold voltage variations due to effects in a longitudinal direction are calculated according to a decay function, $\lambda_i(r)=1/((x_i/\alpha)^{\beta i}+\epsilon_i)$, where $\alpha_i$, $\beta_i$ and $\epsilon_i$, are process and material-related factors; and
    threshold voltage variations due to effects in a transverse direction are calculated according to the complementary error function, erfc.

5. Data storage means for use with a digital computer having a processor, the data storage means having stored thereon a computer program configured to perform the steps of
    selecting a diffusion area within the layout for analysis;
    identifying Si/STI edges on the selected area;

identifying channel areas and their associated gate/Si edges;

determining threshold voltage variations in each identified channel area, including the steps of calculating threshold voltage variations due to effects in a longitudinal direction;

calculating threshold voltage variations due to effects in a transverse direction; and combining the longitudinal and transverse variations to provide an overall variation, wherein calculating threshold voltage variations includes multiplying the maximum threshold voltage variation by a decay function of the form $$\lambda_i(r)=1/((x_i/\alpha)^{\beta i}+\epsilon_i),$$

where $\alpha_i$, $\beta_i$ and $\epsilon_i$, are process and material-related factors, and r is a distance in either the X or Y direction.

6. Data storage means for use with a digital computer having a processor, the data storage means having stored thereon a computer program configured to perform the steps of selecting a diffusion area within the layout for analysis;

identifying Si/STI edges on the selected area;

identifying channel areas and their associated gate/Si edges;

determining threshold voltage variations in each identified channel area, including the steps of calculating threshold voltage variations due to effects in a longitudinal direction;

calculating threshold voltage variations due to effects in a transverse direction; and combining the longitudinal and transverse variations to provide an overall variation, wherein calculating threshold voltage variations includes multiplying the maximum threshold voltage variation by a decay function, wherein threshold voltage variations due to effects in a longitudinal direction are calculated according to a decay function, $$\lambda_i(x)=1/((xi/\alpha)^{\beta i}+\epsilon_i),$$

where $\alpha_i$, $\beta_i$ and $\epsilon_i$, are process and material-related factors; and threshold voltage variations due to effects in a transverse direction are calculated according to the complementary error function, erfc.

\* \* \* \* \*